US009697885B1

(12) United States Patent
Kim

(10) Patent No.: US 9,697,885 B1
(45) Date of Patent: Jul. 4, 2017

(54) SEMICONDUCTOR MEMORY DEVICE AND METHOD FOR TRANSFERRING WEAK CELL INFORMATION

(71) Applicant: SK hynix Inc., Gyeonggi-do (KR)

(72) Inventor: Youk-Hee Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/298,065

(22) Filed: Oct. 19, 2016

(30) Foreign Application Priority Data

Jun. 10, 2016 (KR) ........................ 10-2016-0072335

(51) Int. Cl.
*G11C 11/00* (2006.01)
*G11C 16/10* (2006.01)
*G11C 11/4093* (2006.01)
*G11C 11/4076* (2006.01)
*G11C 11/408* (2006.01)
*G11C 11/4094* (2006.01)
*G11C 11/4096* (2006.01)

(52) U.S. Cl.
CPC ...... *G11C 11/4093* (2013.01); *G11C 11/4076* (2013.01); *G11C 11/4085* (2013.01); *G11C 11/4087* (2013.01); *G11C 11/4094* (2013.01); *G11C 11/4096* (2013.01)

(58) Field of Classification Search
CPC ............. G11C 11/40611; G11C 11/408; G11C 11/4085; G11C 29/76; G11C 29/783; G11C 7/12; G11C 11/406; G11C 11/4063; G11C 29/00; G11C 8/18
See application file for complete search history.

(56) References Cited

U.S. PATENT DOCUMENTS

| 8,446,785 | B2 * | 5/2013 | Park .................... G11C 7/1066 365/191 |
| 8,935,467 | B2 * | 1/2015 | Yu .......................... G06F 12/00 365/222 |
| 9,129,702 | B2 * | 9/2015 | Kim ...................... G11C 11/406 |
| 9,274,939 | B2 * | 3/2016 | Lee ......................... G06F 12/02 |
| 9,349,433 | B2 * | 5/2016 | Wang ................. G11C 11/4063 |
| 9,437,274 | B1 * | 9/2016 | Kim ...................... G11C 11/406 |
| 9,607,679 | B1 * | 3/2017 | Kim .................. G11C 11/40615 |

(Continued)

FOREIGN PATENT DOCUMENTS

KR 1020170034176 3/2017

*Primary Examiner* — Hien Nguyen
(74) *Attorney, Agent, or Firm* — IP & T Group LLP

(57) ABSTRACT

A semiconductor memory device includes: a weak cell controller for programming weak cell information, outputting the weak cell information in response to an initialization signal or a write end signal, and outputting a read end signal whenever the weak cell information is outputted; a memory cell array region that includes memory cells for storing data in response to a row active signal and a column selection signal, and includes a first cell region for storing the weak cell information; an information transfer control circuit for generating a column address based on a column counting signal generated by using the read end signal, and generating a row address whenever the column counting signal reaches a predetermined value in response to the initialization signal; a row circuit for enabling the row active signal; and a column circuit for outputting the column selection signal by decoding the column address.

20 Claims, 11 Drawing Sheets

(56) References Cited

U.S. PATENT DOCUMENTS

| | | | |
|---|---|---|---|
| 2016/0012880 A1* | 1/2016 | Kim | G11C 11/40622 |
| | | | 365/189.07 |
| 2016/0163373 A1* | 6/2016 | Hyun | G11C 11/4087 |
| | | | 365/189.05 |
| 2016/0351248 A1* | 12/2016 | Jung | G11C 11/40618 |
| 2017/0084353 A1* | 3/2017 | Park | G11C 29/78 |
| 2017/0110200 A1* | 4/2017 | Kim | G11C 17/18 |

* cited by examiner

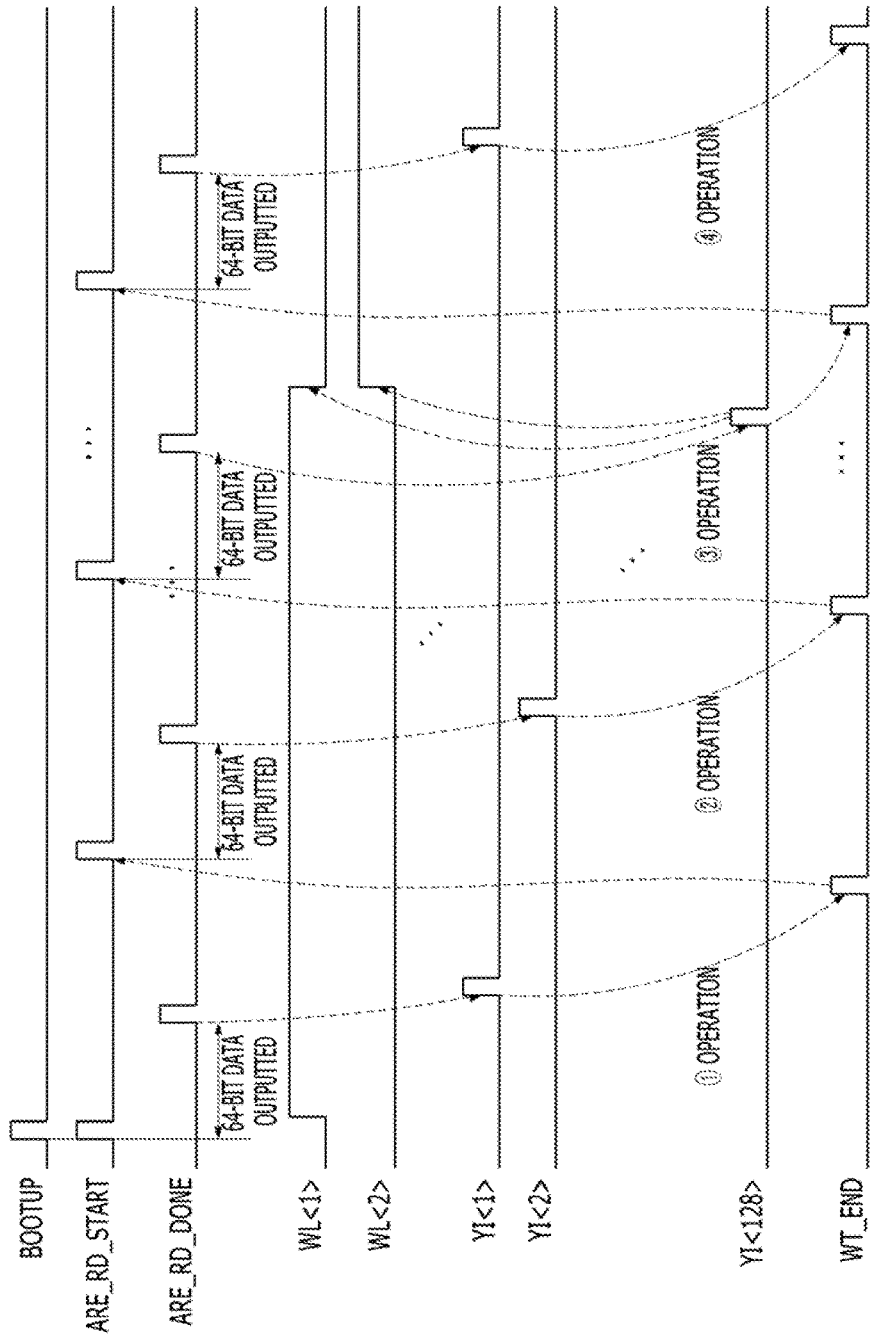

SEMICONDUCTOR MEMORY DEVICE AND METHOD FOR TRANSFERRING WEAK CELL INFORMATION

CROSS-REFERENCE TO RELATED APPLICATIONS

The present application claims priority to Korean Patent Application No. 10-2016-0072335, filed on Jun. 10, 2016, which is herein incorporated by reference in its entirety.

BACKGROUND

1. Field

Exemplary embodiments of the present invention relate to a semiconductor design technology, and more particularly, to a process for detecting and screening weak cells of a semiconductor memory device.

2. Description of the Related Art

Each memory cell of a semiconductor memory device, such as a dynamic random access memory (DRAM) device, generally includes a transistor that functions as a switch and a capacitor that stores charges, which represent data. Whether data is in a 'high' level, which is logic '1', or a 'low' level, which is logic '0', is decided based on whether or not there are charges in the capacitor of a memory cell, that is, whether the terminal voltage of the capacitor is high or low.

The retention of data signifies a state that charges are accumulated in a capacitor. Theoretically, power is not consumed in this state. However, since the initial amount of charges stored in a capacitor may disappear due to leakage current caused by a PN bond of a metal-oxide semiconductor (MOS) transistor, the data stored in the capacitor may be lost. To protect the data from being lost, the data of the memory cell has to be read before the data gets lost to produce read information, and then the capacitor has to be re-charged according to the read information to keep the initial amount of charges. This operation has to be performed periodically to retain the data, which is called a 'refresh operation.'

The refresh operation is performed whenever a refresh command is inputted into a memory device from a memory controller. The memory controller inputs a refresh command to the memory device whenever a predetermined time passes in consideration of a data retention time of the memory device. For example, when the data retention time of a memory device is approximately 64 ms and all the memory cells of the memory device may be refreshed only after the refresh command is inputted approximately 8000 times, the memory controller inputs the refresh command to the memory device approximately 8000 times within approximately 64 ms.

Furthermore, when the data retention time of some memory cells included in a memory device does not exceed a predetermined reference time during the process of testing the memory device, the memory device including such memory cells is regarded as a failed memory device and then abandoned.

When the memory device including the memory cells whose data retention time is shorter than the predetermined reference time, which are called 'weak cells,' is abandoned, a problem with the yield being deteriorated may arise. Additionally, even though a memory device passes the test, when weak cells occur at a later time, errors may occur in the memory device.

Moreover, since more than tens of millions of memory cells are integrated in a high density in one chip, the weak cells are more likely to appear despite advancements in the fabrication process. If an accurate test is not performed for the weak cells, the reliability of the memory device is damaged.

For this reason, researchers and the industry are developing diverse processes for detecting and screening weak cells.

SUMMARY

Embodiments of the present invention are directed to a semiconductor memory device that may transfer weak cell information from a non-volatile memory to a memory cell region, and a method for operating the semiconductor memory device.

In accordance with an embodiment of the present invention, a semiconductor memory device includes: a weak cell control circuit suitable for programming weak cell information internally, outputting the programmed weak cell information in response to an initialization signal or a write end signal, and outputting a read end signal whenever the weak cell information is outputted; a memory cell array region that includes memory cells suitable for storing data in response to a row active signal and a column selection signal, and includes a first cell region suitable for storing the weak cell information outputted from the weak cell control circuit; an information transfer control circuit suitable for generating a column address based on a column counting signal which is generated by using the read end signal, and generating a row address whenever the column counting signal reaches a predetermined value in response to the initialization signal; a row circuit suitable for enabling the row active signal by decoding the row address; and a column circuit suitable for outputting the column selection signal by decoding the column address.

The weak cell control circuit may output the programmed weak cell information on a basis of a K*M-bit unit, K and M being a positive integer, and the semiconductor memory device may further include: a write driver for storing the weak cell information transferred from the weak cell control circuit in the first cell region in response to a write signal, and after the weak cell information is stored in the first cell region, for outputting the write end signal.

The first cell region may include K cell matrices each of which is coupled to the weak cell control circuit through M data lines, and when the initialization signal is enabled, the weak cell information of the K*M-bit unit stored in the write driver may be allocated to and stored in the K cell matrices by M bits in response to the row active signal and the column selection signal.

The first cell region may include a dummy matrix.

The information transfer control circuit may include: a column controller for generating the column counting signal by counting the read end signal, outputting a full count signal whenever the column counting signal reaches the predetermined value, selecting one between the column counting signal and an externally inputted column address in response to a selection signal, and outputting the selected one as the column address; and a row controller for generating a row counting signal in response to the initialization signal or the full count signal, selecting one between the row counting signal and an externally inputted row address, and outputting the selected one as the row address.

the column controller may include: a column counting unit for generating the column counting signal by counting the read end signal and outputting the full count signal whenever the column counting signal reaches the predetermined value; and a column address selecting unit for selecting one between the column counting signal and the externally inputted column address in response to the selection signal and outputting the selected one as the column address.

The column counting unit may initialize the column counting signal in response to the full count signal.

The row controller may include: a row counting unit for generating the row counting signal whenever the initialization signal or the full count signal is inputted; and a row address selecting unit for selecting one between the row counting signal and the externally inputted row address in response to the selection signal and outputting the selected one as the row address.

The information transfer control circuit may further include: a selection signal generator for generating the selection signal which is enabled in response to the initialization signal and disabled when the number of times that the full count signal is counted reaches a predetermined number corresponding to the number of word lines.

The weak cell control circuit may include a non-volatile memory.

The memory cells of the memory cell array region may include volatile memory cells.

In accordance with another embodiment of the present invention, a semiconductor memory device includes: a weak cell control circuit suitable for programming weak cell information internally, outputting the programmed weak cell information in response to an initialization signal or a write end signal, and outputting a read end signal whenever the weak cell information is outputted; a column controller suitable for generating a column counting signal by using the read end signal, and outputting the column counting signal as a column address; a row controller suitable for generating a row counting signal in response to the initialization signal when the column counting signal reaches a predetermined value, and outputting the row counting signal as a row address; and a memory cell array region that includes a first cell region suitable for storing weak cell information outputted from the weak cell control circuit based on the row address and the column address.

The weak cell control circuit may output the programmed weak cell information on a basis of a K*M-bit unit, K and M being a positive integer, and the semiconductor memory device may further include a write driver for storing the weak cell information transferred from the weak cell control circuit in the first cell region in response to a write signal, and after the weak cell information is stored in the first cell region, outputting the write end signal.

The first cell region may include a dummy matrix.

The column controller may include: a column counting unit for generating the column counting signal by counting the read end signal and outputting a full count signal whenever the column counting signal reaches the predetermined value, and the column counting unit for initializing the column counting signal in response to the full count signal.

The row controller may include: a row counting unit for generating the row counting signal whenever the initialization signal or the full count signal is inputted.

In accordance with yet another embodiment of the present invention, a method for operating a semiconductor memory device which includes a first cell region provided with K cell matrices each of which is coupled to a weak cell control circuit through M data lines includes: enabling a word line corresponding to a row address during a boot-up operation; outputting a read end signal after reading weak cell information from the weak cell control circuit on a basis of a K*M-bit unit during the boot-up operation; generating a column address based on a column counting signal which is generated by using the read end signal, programming the weak cell information in the K cell matrices by M bits in response to a column selection signal which corresponds to the column address, and enabling a write end signal; reading the weak cell information stored in the weak cell control circuit again on the basis of the K*M-bit unit in response to the write end signal and outputting the read end signal; and repeating the operation of generating the column address based on the column counting signal which is generated by using the read end signal, programming the weak cell information in the K cell matrices by M bits in response to the column selection signal which corresponds to the column address, and enabling the write end signal, and the operation of reading the weak cell information stored in the weak cell control circuit again on the basis of the K*M-bit unit in response to the write end signal and outputting the read end signal, until the column counting signal reaches a predetermined value.

The enabling of the word line corresponding to the row address during the boot-up operation may include: generating the row address in response to an initialization signal; enabling a first word line which corresponds to the row address; and disabling the first word line and enabling a second word line, when the column counting signal reaches the predetermined value.

The operation of generating the column address based on the column counting signal which is generated by using the read end signal, programming the weak cell information in the K cell matrices by M bits in response to the column selection signal which corresponds to the column address, and enabling the write end signal may include: generating the column counting signal by counting the read end signal; generating the column address based on the column counting signal; and outputting the full count signal when the column counting signal reaches the predetermined value.

The method may further include initializing the column counting signal in response to the full count signal.

BRIEF DESCRIPTION OF THE DRAWINGS

FIG. 6 is a waveform diagram illustrating an operation of the semiconductor memory device shown in FIG. 2.

DETAILED DESCRIPTION

Figure 1:
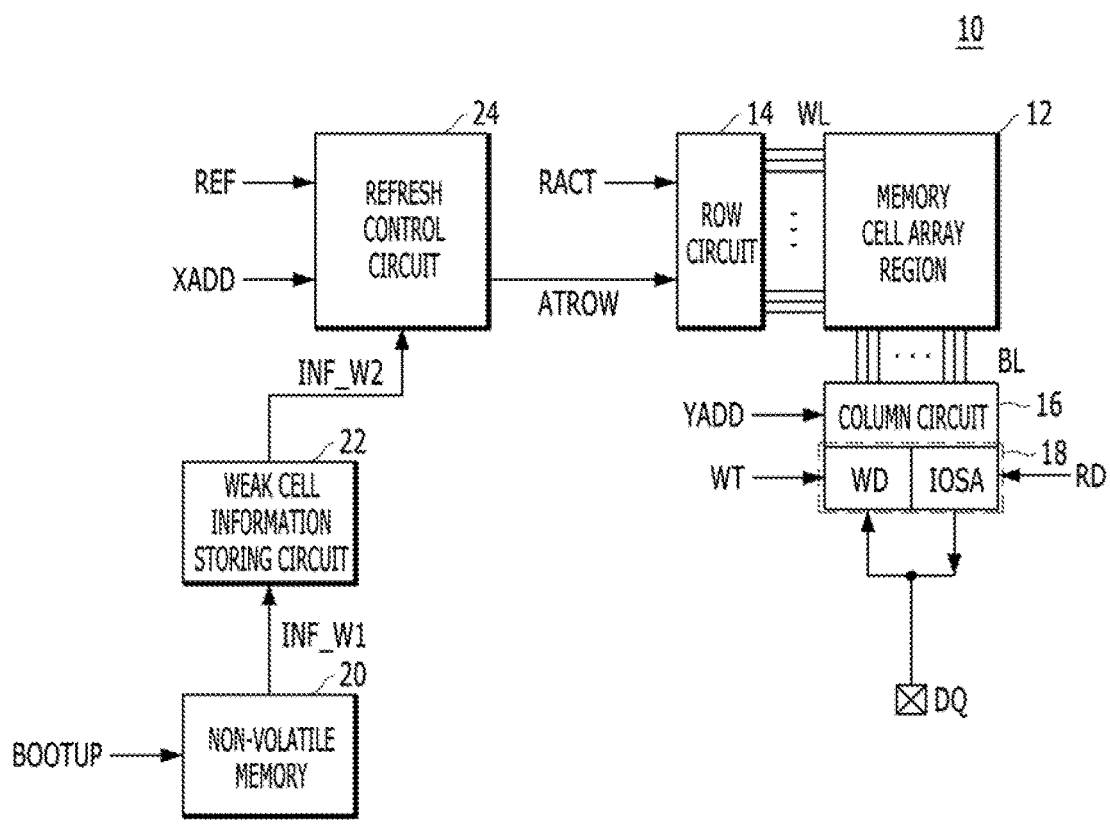
FIG. 1 is a block diagram illustrating a general semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Generally, semiconductor memory devices store information for its weak cells that are detected after going through diverse kinds of weak cell detection tests in a non-volatile memory which is provided in the inside of the semiconductor memory device so that the stored data may be retained even though a power supply is cut off.

If weak cell information stored in a non-volatile memory is read and used for a normal operation that is performed right after power is supplied, an error may occur in the operation due to lowered reliability. To prevent such error from occurring, the weak cell information stored in the non-volatile memory may be transferred and stored in a storage circuit, such as a latch, during a boot-up operation, and then a refresh operation may be optionally performed by using the weak cell information stored in the storage circuit during a normal operation.

Hereafter, a structure of a general semiconductor memory device is described with reference to FIG. 1. The structure of the general semiconductor memory will be described focusing on a structure related to a refresh operation. Furthermore, the semiconductor memory device is described by taking an example of one memory bank.

FIG. 1 is a block diagram illustrating a general semiconductor memory device 10.

Referring to FIG. 1, the semiconductor memory device 10 includes a memory cell array region 12, a row circuit 14, a column circuit 16, a data input/output circuit 18, a non-volatile memory 20, a weak cell information storing circuit 22, and a refresh control circuit 24.

The memory cell array region 12 may include memory cells for storing data. The memory cells may be coupled to the row circuit 14 through word lines WL, and coupled to the column circuit 16 through bit lines BL. Herein, the memory cell array region 12 may include a normal cell region (not shown) and a redundancy cell region (not shown). When a failure cell, which is a repair target memory cell, is detected in the normal cell region, the normal word line coupled to the repair target memory cell may be replaced with a redundancy word line disposed in the redundancy cell region, which is called a repair operation. Detailed description on the repair operation will be omitted herein.

The row circuit 14 may enable a word line WL that corresponds to a target row address ATROW outputted from the refresh control circuit 24 in response to a row active signal RACT.

The column circuit 16 may generate a column selection signal YI for accessing data of a particular bit line BL by decoding a column address YADD.

The data input/output circuit 18 may include a sense amplifier IOSA and a write driver WD. The sense amplifier IOSA outputs a data transferred from a bit line BL selected based on the column address YADD to a DQ pad in response to a read signal RD during a read operation. The write driver WD transfers and stores data inputted from the DQ pad to a bit line BL that corresponds to the column address YADD in response to a write signal WT during a write operation.

The non-volatile memory 20 may include a plurality of fuses (not shown) for programming weak cell information. The non-volatile memory 20 may output programmed weak cell information INF_W1 to the weak cell information storing circuit 22 in response to a boot-up signal BOOTUP. The weak cell information storing circuit 22 may store the weak cell information INF_W1 transferred from the non-volatile memory 20, and output the stored weak cell information INF_W2 to the refresh control circuit 24.

The refresh control circuit 24 may select a row address XADD or a refresh address generated by counting a refresh signal REF and output the target row address ATROW. During a refresh operation, the refresh control circuit 24 may select the refresh address generated by counting the refresh signal REF and output the selected refresh address as the target row address ATROW. Herein, the refresh control circuit 24 may optionally output the target row address ATROW in such a manner that the refresh cycle of the word line that is coupled to a weak cell based on the weak cell information INF_W2 is controlled.

Herein, the weak cell information INF_W1 stored in the non-volatile memory 20 is not directly used, but the weak cell information INF_W1 is moved to the weak cell information storing circuit 22 and stored in the weak cell information storing circuit 22 and then used. Since the non-volatile memory 20 is formed in an array form, it takes a predetermined time to call the data in the inside of the non-volatile memory 20. Since the data cannot be instantly called from the non-volatile memory 20, it is impossible to immediately use the data stored in the non-volatile memory 20 for performing a refresh operation. Therefore, a boot-up operation in which the weak cell information INF_W1 stored in the non-volatile memory 20 is transferred to and stored in the weak cell information storing circuit 22 is performed and then a refresh operation may be performed using the weak cell information INF_W2 stored in the weak cell information storing circuit 22 after the boot-up operation is performed.

Furthermore, as the capacity of semiconductor memory devices increases, the number of weak cells also increases. This raises the capacities of the non-volatile memory 20 and the weak cell information storing circuit 22 that are programmed with weak cell information. As a result, the area occupied by unit latches that are disposed in the inside of the weak cell information storing circuit 22 in a semiconductor memory device increases as well.

Hereafter, a method for reducing a circuit area without changing existing structures is described by using a portion of a memory cell array region such as a dummy cell region as a weak cell information storing circuit in accordance with an embodiment of the present invention.

Figure 2:
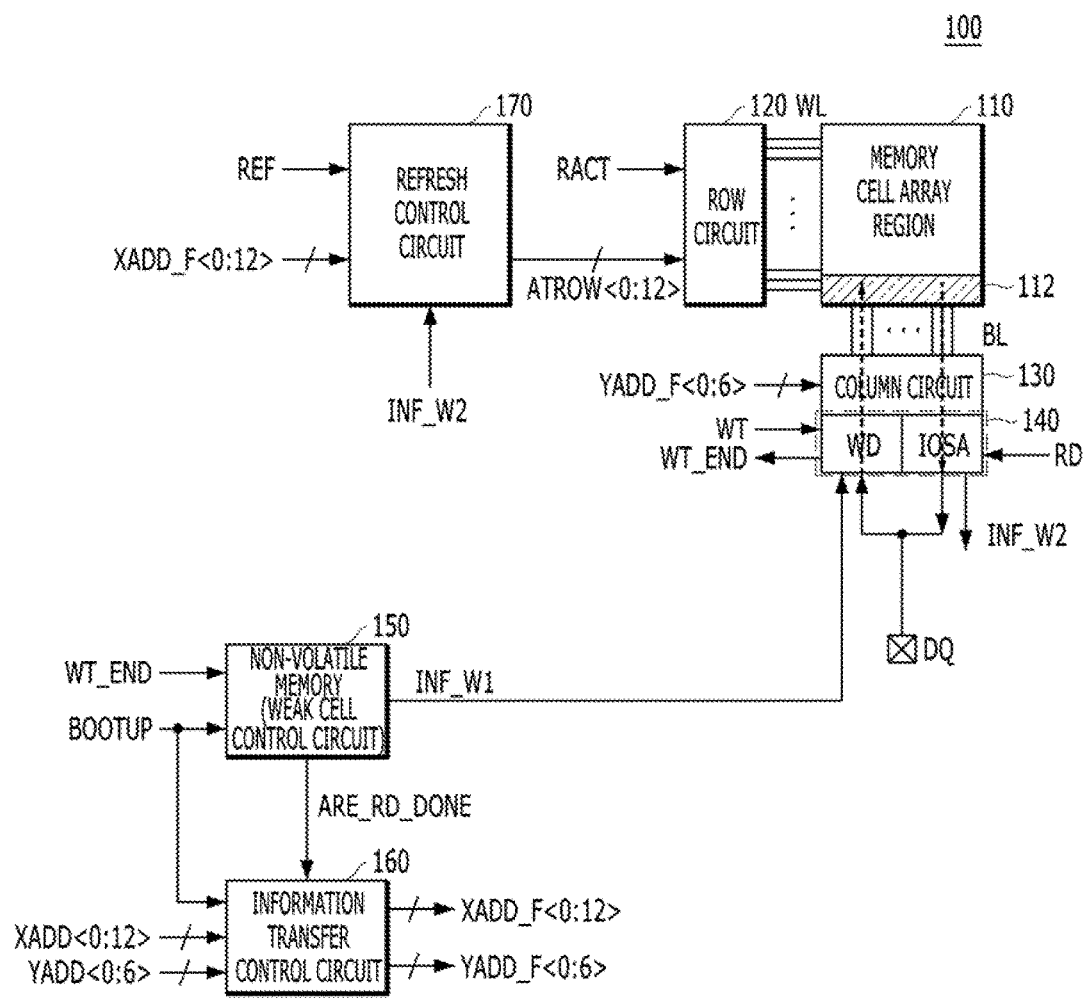
FIG. 2 is a block diagram illustrating a semiconductor memory device in accordance with an embodiment of the present invention.

FIG. 2 is a block diagram illustrating a semiconductor memory device 100 in accordance with an embodiment of the present invention. FIG. 2 shows a case when a semiconductor memory device includes one memory bank, and a 13-bit pre-row address XADD<0:12> and a 7-bit pre-column address YADD<0:6> are inputted.

Referring to FIG. 2, the semiconductor memory device 100 includes a memory cell array region 110, a row circuit 120, a column circuit 130, a data input/output circuit 140, a non-volatile memory 150, an Information transfer control circuit 160, and a refresh control circuit 170.

Although not illustrated in the drawing, the semiconductor memory device 100 may further include a command decoder (not shown) and an active signal generator (not shown). The command decoder may generate a refresh signal REF, a write signal WT, a read signal RD, an active signal ACT, and a pre-charge signal PCG by decoding external commands RST, /CS, /RAS, /CAS and /WE in response to a clock signal CLK. The active signal generator may generate a row active signal RACT in response to the active signal ACT and the pre-charge signal PCG. The semiconductor memory device 100 may further include an address buffer (not shown) that buffers an external address ADD and outputs a pre-row address XADD<0:12> and a pre-column address YADD<0:6>.

The memory cell array region 110 may include a plurality of cell matrices each of which includes a plurality of memory cells for storing data. The memory cells may be coupled to the row circuit 120 through word lines WL, and coupled to the column circuit 130 through bit lines BL. Data may be stored in the memory cells that are selected based on a word line enable signal WL<1:M> transferred from the row circuit 120 and a column selection signal YI<1:128> transferred from the column circuit 130. According to the embodiment of the present invention, the memory cell array region 110 may include volatile memory cells. According to another embodiment of the present invention, the memory cell array region 110 may include memory cells of a dynamic random access memory (DRAM).

According to the embodiment of the present invention, a portion of the memory cell array region 110 may be reserved as a weak cell information storing region 112 that stores weak cell information INF_W1 that is read from the non-volatile memory 150. That is, a portion of the memory cell array region 110 may be allocated as the weak cell information storing region 112 for storing the weak cell information INF_W1 that is read from the non-volatile memory 150, and the other portion of the memory cell array region 110 may be allocated as a normal memory cell region for storing data during a normal operation. According to another embodiment of the present invention, a dummy matrix or a dummy cell region of the memory cell array region 110 may be allocated for the weak cell information storing region 112.

The non-volatile memory 150 may be formed of a weak cell control circuit which is provided with a plurality of fuses (not shown) for programming the weak cell information INF_W1. The non-volatile memory 150 may initiate a read operation for reading the programmed weak cell information INF_W1 in response to a boot-up signal BOOTUP. When the boot-up signal BOOTUP is enabled, the non-volatile memory 150 may read the programmed weak cell information INF_W1 on the basis of a K*M-bit unit, and then sequentially read the weak cell information INF_W1 on the basis of a K*M-bit unit in response to a write end signal WT_END. Additionally, the non-volatile memory 150 may output a read end signal ARE_RD_DONE whenever a read operation of reading the weak cell information INF_W1 on the basis of a K*M-bit unit is completed. Herein, the "K" is the number of cell matrices included in the weak cell information storing region 112 of the memory cell array region 110, and the "M" is the number of data lines that are allocated to each of the K cell matrices. Hereafter, the weak cell information storing region 112 includes 8 cell matrices and each of the 8 cell matrices is allocated with 8 data lines however the number of cell matrices and data lines are not each limited to 8. That is, when the weak cell information INF_W1 is sequentially outputted from the non-volatile memory 150 on the basis of a 64-bit unit is provided as an example.

In accordance with the embodiment of the present invention, the non-volatile memory 150 may be one non-volatile memory selected among an array e-fuse (ARE) circuit, a laser fuse circuit, a NAND flash memory, a NOR flash memory, a Magnetic Random Access Memory (MRAM), a Spin Transfer Torque Magnetic Random Access Memory (STT-MRAM), a Resistive Random Access Memory (Re-RAM), and a Phase-Change Random Access Memory (PC RAM).

Although FIG. 2 describes that the non-volatile memory 150 includes a plurality of fuses (not shown) for programming the weak cell information INF_W1, the scope of the present invention is not limited to it. According to another embodiment of the present invention, the non-volatile memory 150 may be a circuit that may receive and store weak cell information from external test equipment.

The row circuit 120 may generate a word line enable signal WL<1:M> for enabling a word line WL that corresponds to a target row address ATROW, which is outputted from the refresh control circuit 170, in response to the row active signal RACT.

The column circuit 130 may generate a column selection signal YI<1:128> for accessing the data of a predetermined bit line BL by decoding a column address YADD_F<0:6>.

The data input/output circuit 140 may include a sense amplifier IOSA and a write driver WD. The sense amplifier IOSA outputs a data transferred from a bit line BL selected based on the column address YADD_F<0:6> to a DQ pad in response to a read signal RD during a read operation. The write driver WD transfers and stores a data inputted from the DQ pad to a bit line BL that corresponds to the column address YADD_F<0:6> in response to a write signal WT during a write operation.

The write driver WD in accordance with the embodiment of the present invention may store the weak cell information INF_W1 that is read on the basis of a 64-bit unit from the non-volatile memory 150 in response to the write signal WT during a boot-up operation, and after the weak cell information INF_W1 is stored, the write driver WD may output a write end signal WT_END. Therefore, during the boot-up operation, the weak cell information INF_W1 that is read out of the non-volatile memory 150 may be stored in the memory cells of the weak cell information storing region 112 that are selected based on the word line enable signal WL<1:M> and the column selection signal YI<1:128>.

The information transfer control circuit 160 may generate the column address YADD_F<0:6> based on a column counting signal that is generated by counting the read end signal ARE_RD_DONE outputted from the non-volatile memory 150 in response to the boot-up signal BOOTUP. The information transfer control circuit 160 may generate a row address XADD_F<0:12> whenever the column counting signal reaches a predetermined value for example, the maximal value.

The refresh control circuit 170 may select one between the row address XADD_F<0:12> and a refresh address that is generated by counting a refresh signal REF, and output the selected address as a target row address ATROW<0:12>. When an operation other than the refresh operation is performed, the refresh control circuit 170 may select the row address XADD_F<0:12> and output it as the target row address ATROW<0:12>. Furthermore, during the refresh operation, the refresh control circuit 170 may select the refresh address that is generated by counting the refresh signal REF and output it as the target row address ATROW<0:12>. Herein, the refresh control circuit 170 may optionally output the target row address ATROW<0:12> in such a manner that the refresh cycle of a word line coupled to a weak cell may be controlled based on the weak cell information INF_W2 that is stored in the weak cell information storing region 112.

As described above, the semiconductor memory device 100 may transfer and store the weak cell information INF_W1 that is programmed in the non-volatile memory 150 to a portion which may be the weak cell information storing region 112 of the memory cell array region 110 during the boot-up operation, and then optionally perform a refresh operation by using the weak cell information stored in the weak cell information storing region 112. In particular, the semiconductor memory device 100 may have reduced areas for a storage circuit such as latches and a circuit for generating control signals related to the storage circuit without changing the existing structures by using a dummy matrix or a dummy cell region in the memory cell array region 110 as the weak cell information storing region 112.

Hereafter, the feature structures of the semiconductor memory device 100 that realize the concept and spirit of the present invention will be described in detail with reference to the accompanying drawings.

Figure 3:
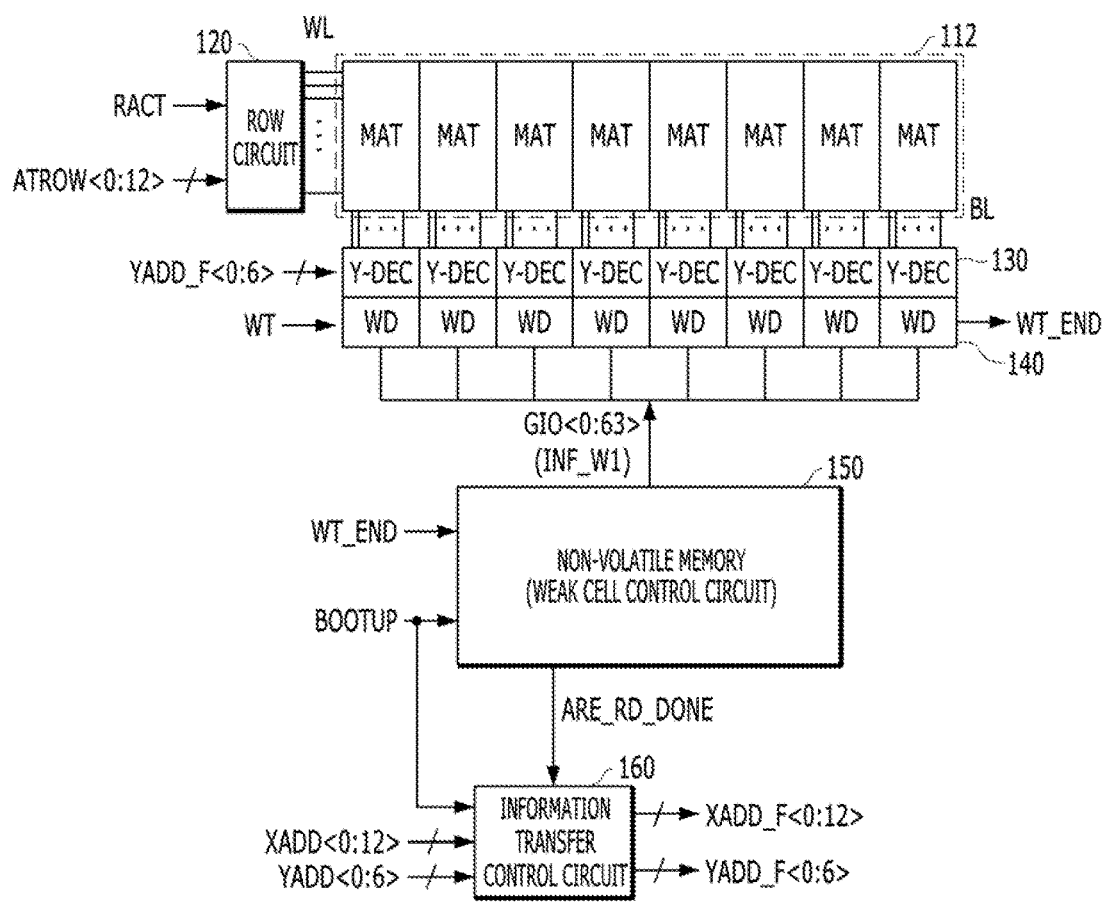
FIG. 3 is a block diagram illustrating a weak cell information storing region shown in FIG. 2.

FIG. 3 is a block diagram illustrating the weak cell information storing region 112 shown in FIG. 2.

Referring to FIG. 3, the weak cell information storing region 112 of the memory cell array region 110 is illustrated to be enlarged. Herein, it is assumed that the weak cell information storing region 112 includes 8 cell matrices (MATs).

When the boot-up signal BOOTUP is enabled, the non-volatile memory 150 may output the programmed weak cell information INF_W1 to a global data input/output line GIO<0:63> on the basis of a 64-bit unit, and then sequentially output the weak cell information INF_W1 on the basis of a 64-bit unit to the global data input/output line GIO<0:63> in response to the write end signal WT_END. The non-volatile memory 150 may output the read end signal ARE_RD_DONE whenever the weak cell information INF_W1 of the 64-bit unit is outputted to the global data input/output line GIO<0:63>.

The information transfer control circuit 160 may generate the column address YADD_F<0:6> based on a column counting signal that is generated by counting the read end signal ARE_RD_DONE outputted from the non-volatile memory 150 in response to the boot-up signal BOOTUP. The information transfer control circuit 160 may generate the row address XADD_F<0:12> whenever the column counting signal reaches a predetermined value for example, the maximal value.

The refresh control circuit 170 (see FIG. 2) may select the row address XADD_F<0:12> and output it as the target row address ATROW<0:12>. The row circuit 120 may generate a word line enable signal WL<1:M> for enabling a word line WL that corresponds to the target row address ATROW<0:12>, which is outputted from the refresh control circuit 170, in response to the row active signal RACT. The column circuit 130 may generate a column selection signal YI<1:128> for accessing the data of a predetermined bit line BL by decoding the column address YADD_F<0:6>.

The write driver WD of the data input/output circuit 140 may store the weak cell information INF_W1 that is transferred on the basis of a 64-bit unit from the non-volatile memory 150 to the global data input/output line GIO<0:63> in the weak cell information storing region 112 in response to the write signal WT during a boot-up operation, and after the weak cell information INF_W1 is stored, the write driver WD may output the write end signal WT_END.

Therefore, during the boot-up operation, the weak cell information INF_W1 that is read out of the non-volatile memory 150 may be stored in the memory cells of the weak cell information storing region 112 that are selected based on the word line enable signal WL<1:M> and the column selection signal YI<1:128>.

Figure 4:
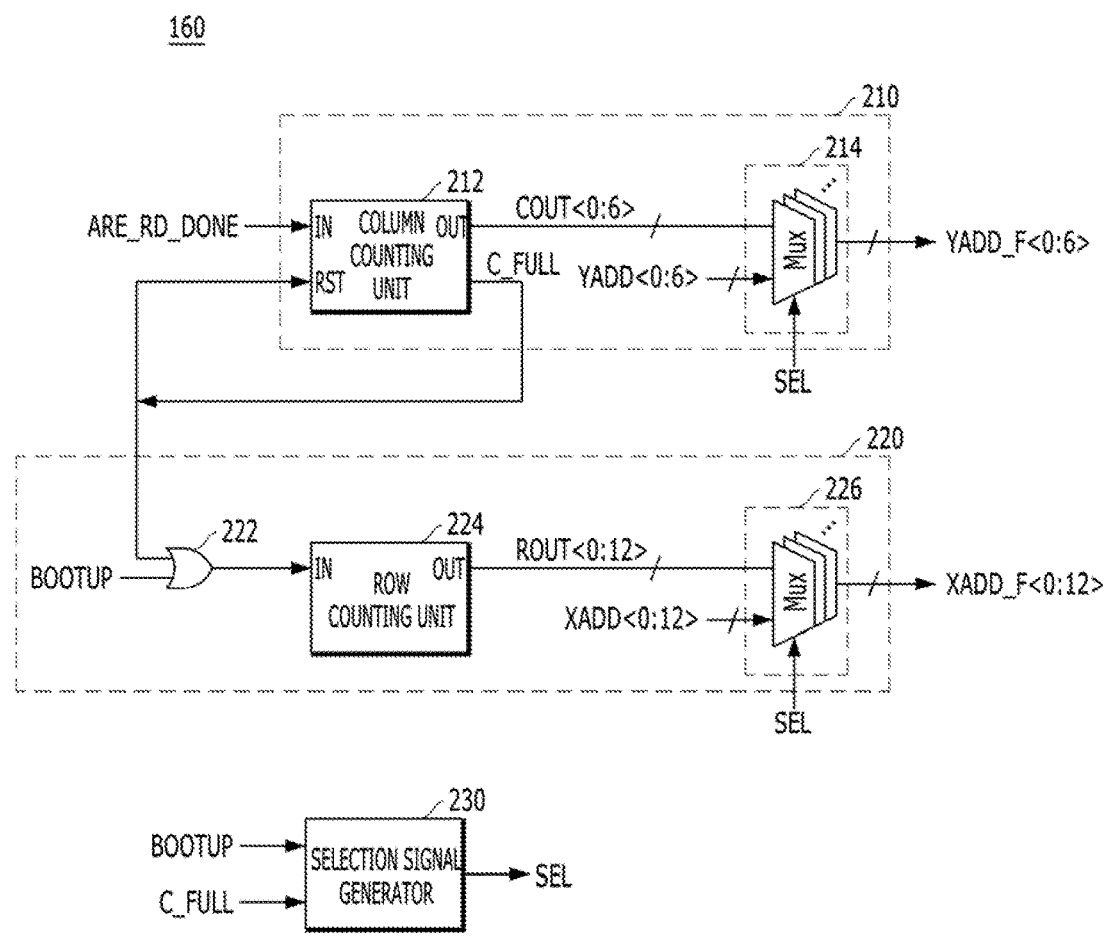
FIG. 4 is a block diagram illustrating an information transfer control circuit shown in FIG. 3.

FIG. 4 is a block diagram illustrating the information transfer control circuit 160 shown in FIG. 3.

Referring to FIG. 4, the information transfer control circuit 160 may include a column controller 210 and a row controller 220.

The column controller 210 may generate a column counting signal COUT<0:6> by counting the read end signal ARE_RD_DONE that is outputted from the non-volatile memory 150. The column controller 210 may output the selected one as the column address YADD_F<0:6> by selecting the column counting signal COUT<0:6> or the pre-column address YADD<0:6> in response to a selection signal SEL. Herein, the column controller 210 may output a full count signal C_FULL whenever the column counting signal COUT<0:6> reaches a predetermined value for example, 128.

The row controller 220 may generate a row counting signal ROUT<0:12> in response to the boot-up signal BOOTUP or the full count signal C_FULL. The row controller 220 may select one between the row counting signal ROUT<0:12> and the pre-row address XADD<0:12> and output the selected one as the row address XADD_F<0:12> in response to the selection signal SEL.

The information transfer control circuit 160 may further include a selection signal generator 230 that generates the selection signal SEL. The selection signal generator 230 may generate the selection signal SEL that is enabled in response to the boot-up signal BOOTUP and disabled when the number of times that the full count signal C_FULL reaches a predetermined number which corresponds to the number of word lines for example, M. Although it is described in FIG. 4 that the selection signal SEL is generated by the selection signal generator 230 included in the information transfer control circuit 160, the scope of the present invention is not limited to it. According to an embodiment of the present invention, the selection signal SEL may be directly transferred from an external controller (not shown).

Specifically, the column controller 210 may include a column counting unit 212 and a column address selecting unit 214. The column counting unit 212 may generate the column counting signal COUT<0:6> by counting the read end signal ARE_RD_DONE, and output the full count signal C_FULL whenever the column counting signal COUT<0:6> reaches a predetermined value for example, 128. The column counting unit 212 may initialize the column counting signal COUT<0:6> in response to the full count signal C_FULL. The column address selecting unit 214 may select one between the column counting signal COUT<0:6> and the pre-column address YADD<0:6> in response to the selection signal SEL and output the selected one as the column address YADD_F<0:6>.

The row controller 220 may include a logic gate unit 222, a row counting unit 224, and a row address selecting unit 226. The logic gate unit 222 may perform an OR operation by receiving the boot-up signal BOOTUP and the full count signal C_FULL. According to an embodiment of the present invention, the logic gate unit 222 may be an OR gate. The row counting unit 224 may generate the row counting signal ROUT<0:12> by counting the output of the logic gate unit 222. The row address selecting unit 226 may select one between the row counting signal ROUT<0:12> and the pre-row address XADD<0:12> and output the selected one as the row address XADD_F<0:12> in response to the selection signal SEL.

Figure 5:
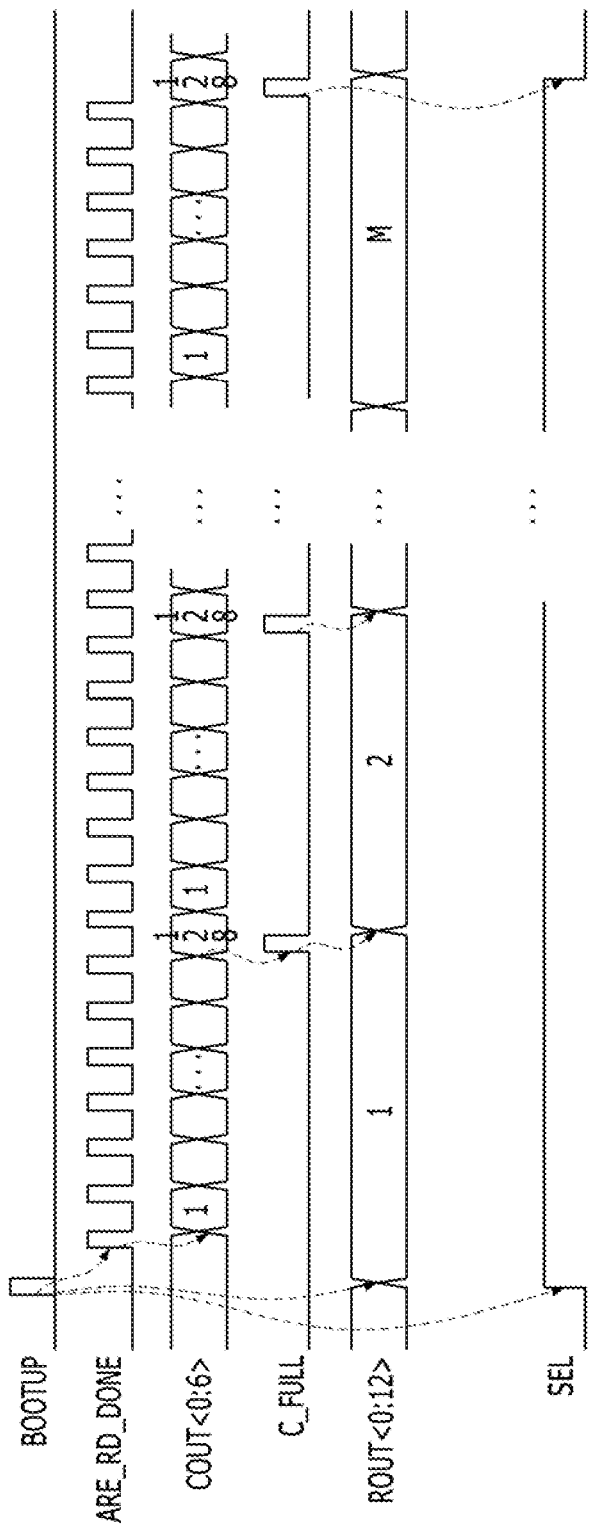
FIG. 5 is a waveform diagram illustrating an operation of the information transfer control circuit shown in FIG. 4.

FIG. 5 is a waveform diagram illustrating an operation of the Information transfer control circuit 160 shown in FIG. 4.

Referring to FIG. 5, when the boot-up signal BOOTUP is enabled, the selection signal generator 230 enables the selection signal SEL. The row counting unit 224 of the row controller 220 generates the row counting signal ROUT<0: 12> of '0000000000001' in response to the boot-up signal BOOTUP. The row address selecting unit 226 selects the row counting signal ROUT<0:12> and outputs it as the row address XADD_F<0:12> in response to the selection signal SEL.

The column counting unit 212 of the column controller 210 generates the column counting signal COUT<0:6> by counting the read end signal ARE_RD_DONE whenever the read end signal ARE_RD_DONE is inputted from the non-volatile memory 150 after the boot-up signal BOOTUP is enabled. The column address selecting unit 214 selects the column counting signal COUT<0:6> and outputs it as the column address YADD_F<0:6> in response to the selection signal SEL.

Subsequently, the column counting unit 212 enables and outputs the full count signal C_FULL when the column counting signal COUT<0:6> reaches a predetermined value for example, 128. The column counting unit 212 initializes the column counting signal COUT<0:6> in response to the full count signal C_FULL. The row counting unit 224 generates the row counting signal ROUT<0:12> of '0000000000010' by counting the full count signal C_FULL, and the row address selecting unit 226 outputs the row counting signal ROUT<0:12> as the row address XADD_F<0:12>.

After the above process is performed M times, and when the number of times that the full count signal C_FULL is enabled reaches a predetermined number of times that corresponds to the number of word lines for example, M, the selection signal generator 230 may disable the selection signal SEL.

Based on the row address XADD_F<0:12> and the column address YADD_F<0:6> that are generated through the above process, the weak cell information INF_W1 programmed in the non-volatile memory 150 may be stored in the weak cell information storing region 112.

Hereafter, an operation of the semiconductor memory device 100 in accordance with an embodiment of the present invention is described with reference to FIGS. 2 to 7D.

FIG. 6 is a waveform diagram illustrating an operation of the semiconductor memory device 100 shown in FIG. 2. FIGS. 7A to 7D illustrate the operations of the semiconductor memory device 100 shown in FIG. 6.

Referring to FIG. 6, when the boot-up signal BOOTUP is enabled, the non-volatile memory 150 initiates a read operation for reading the programmed weak cell information INF_W1. That is, the non-volatile memory 150 enables a read start signal ARE_RD_START internally, and outputs the programmed weak cell information INF_W1 on the basis of a 64-bit unit. In response to the boot-up signal BOOTUP, the row controller 220 outputs the row counting signal ROUT<0:12> as the row address XADD_F<0:12>. Accordingly, the refresh control circuit 170 selects the row address XADD_F<0:12> and outputs it as the target row address ATROW<0:12>. The row circuit 120 enables a first word line enable signal WL<1> that corresponds to the target row address ATROW<0:12> in response to the row active signal RACT.

Subsequently, when the read operation of reading the weak cell information INF_W1 of the 64-bit unit is completed, the non-volatile memory 150 enables and outputs the read end signal ARE_RD_DONE. The column controller 210 generates the column counting signal COUT<0:6> by counting the read end signal ARE_RD_DONE, and outputs the generated column counting signal COUT<0:6> as the column address YADD_F<0:6>. The column circuit 130 enables a first column selection signal YI<1> by decoding the column address YADD_F<0:6>. The write driver WD of the data input/output circuit 140 stores the weak cell information INF_W1 of the 64-bit unit that is transferred from the non-volatile memory 150 in the weak cell information storing region 112. After the weak cell information INF_W1 is stored in the weak cell information storing region 112, the write driver WD may output the write end signal WT_END.(①operation)

Figure 7A:
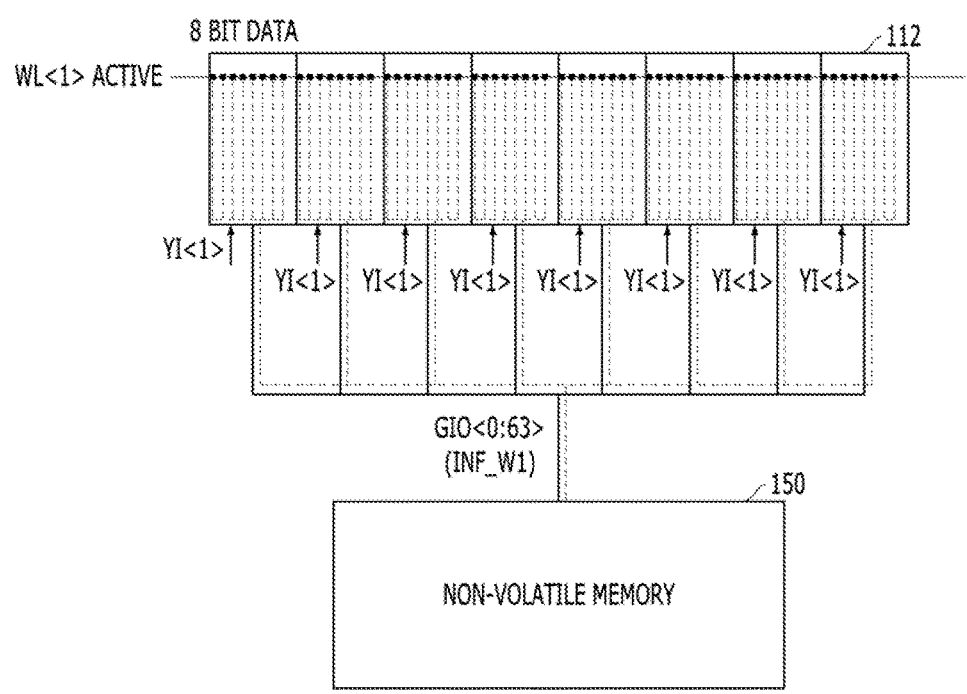
FIGS. 7A to 7D illustrate the operations of the semiconductor memory device shown in FIG. 6.

FIG. 7A shows an operation of storing the weak cell information INF_W1 of the 64-bit unit outputted from the non-volatile memory 150 in the memory cells that are selected based on the first word line enable signal WL<1> and the first column selection signal YI<1>. Since the weak cell information storing region 112 includes 8 cell matrices, the weak cell information INF_W1 of the 64-bit unit is transferred through the global data input/output line GIO<0: 63> and stored in each cell matrix as 8-bit data.

Subsequently, the non-volatile memory 150 enables the read start signal ARE_RD_START internally and accordingly outputs the programmed weak cell information INF_W1 on the basis of a 64-bit unit in response to the write end signal WT_END. After the read operation is completed, the non-volatile memory 150 enables and outputs the read end signal ARE_RD_DONE. The column controller 210 generates the column counting signal COUT<0:6> again by counting the read end signal ARE_RD_DONE again, and outputs the generated column counting signal COUT<0:6> as the column address YADD_F<0:6>. The column circuit 130 enables a second column selection signal YI<2> by decoding the column address YADD_F<0:6>. The write driver WD of the data input/output circuit 140 stores the weak cell information INF_W1 of the 64-bit unit in the weak cell information storing region 112. After the weak cell information INF_W1 is stored in the weak cell information storing region 112, the write driver WD may output the write end signal WT_END.(②operation)

Figure 7B:
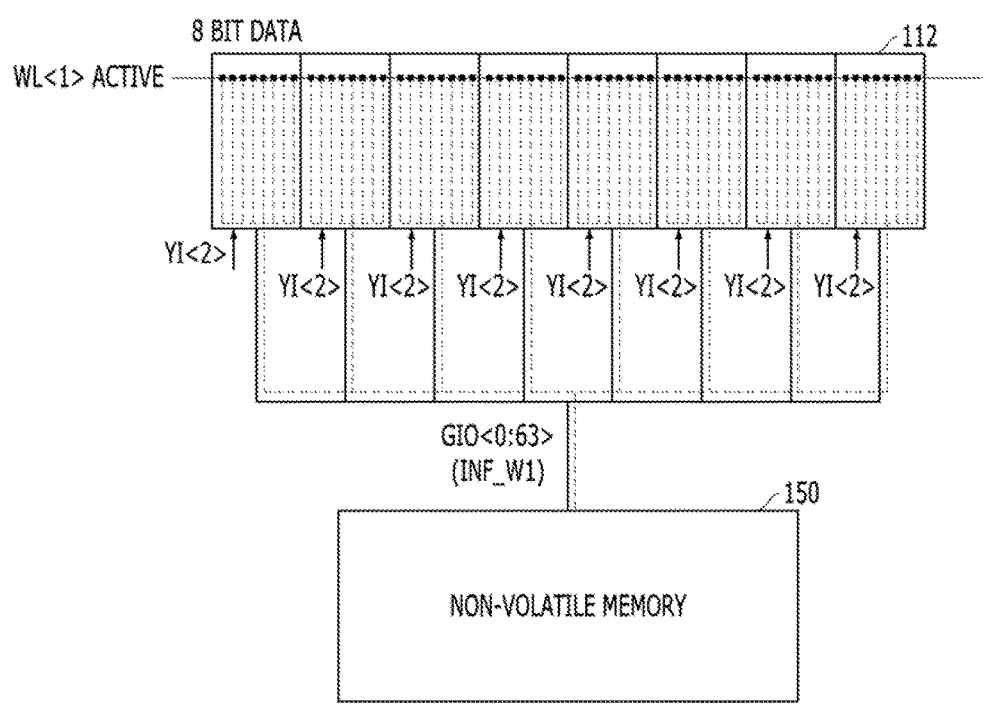

FIG. 7B shows an operation for storing the weak cell information INF_W1 of the 64-bit unit outputted from the non-volatile memory 150 in the memory cells that are selected based on the first word line enable signal WL<1> and the second column selection signal YI<2>.

Figure 7C:
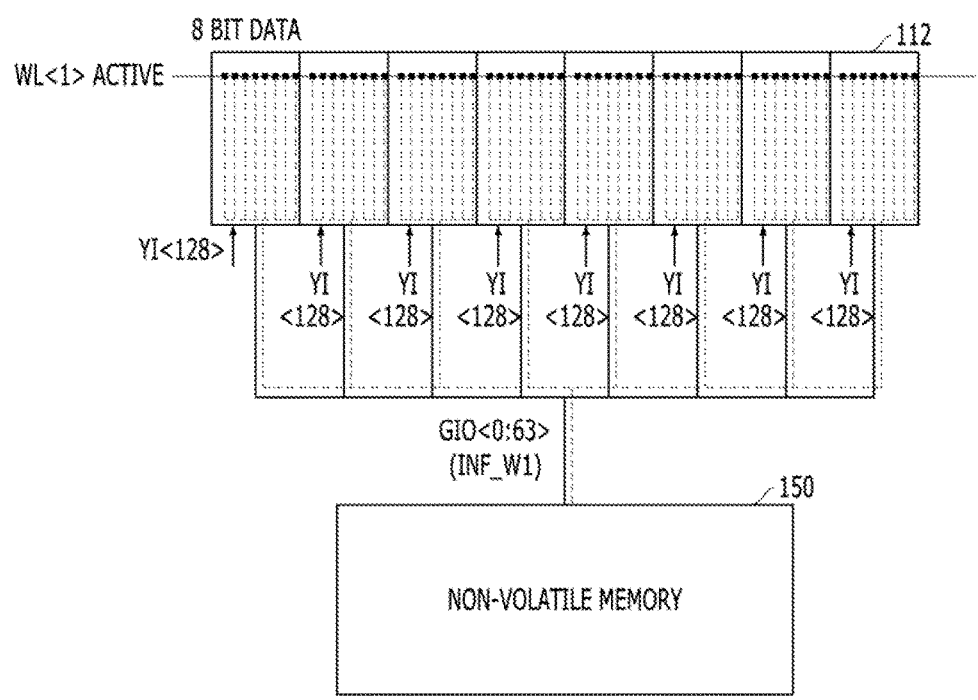

The above operation (②operation) may be performed repeatedly until the last column selection signal YI<128> is enabled. (③operation) FIG. 7C shows an operation of storing the weak cell information INF_W1 of the 64-bit unit outputted from the non-volatile memory 150 in the memory cells that are selected based on the first word line enable signal WL<1> and the $128^{th}$ column selection signal YI<128>.

After the ③operation is completed, a write operation for the first word line is finished, and a write operation for a second word line begins. That is, the column controller 210 outputs the full count signal C_FULL and initializes the column counting signal COUT<0:6>, when the column counting signal COUT<0:6> reaches 128. The row controller 220 generates the row address XADD_F<0:12> in response to the full count signal C_FULL. As a result, the first word line enable signal WL<1> may be disabled and a second word line enable signal WL<2> may be enabled.

Subsequently, when the read end signal ARE_RD_DONE is enabled, the column controller 210 counts the read end signal ARE_RD_DONE again, and outputs the column address YADD_F<0:6>. The column circuit 130 enables the first column selection signal YI<1>. The write driver WD of the data input/output circuit 140 stores the weak cell information INF_W1 of the 64-bit unit in the weak cell information storing region 112. After the weak cell information INF_W1 is stored in the weak cell information storing region 112, the write driver WD may output the write end signal WT_END.(④ operation)

Figure 7D:
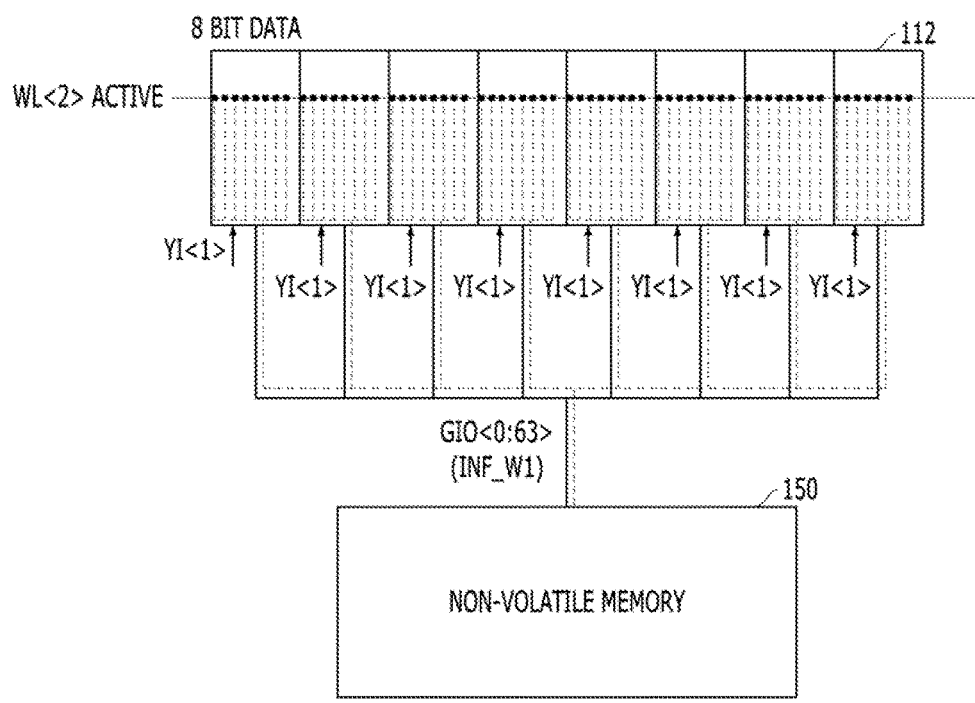

FIG. 7D shows an operation for storing the weak cell information INF_W1 of the 64-bit unit outputted from the non-volatile memory 150 in the memory cells that are selected based on the second word line enable signal WL<2> and the first column selection signal YI<1>.

The above operation may be performed repeatedly until the weak cell information INF_W1 of the 64-bit unit outputted from the non-volatile memory 150 is stored in the memory cells that are selected based on the last word line enable signal WL<M> and the last column selection signal YI<128>. After all the storing operations are completed, when the number of times that the full count signal C_FULL is enabled reaches a predetermined number that corresponds to the number of the word lines, which is M, the selection signal SEL may be disabled and the operation of storing the programmed weak cell information INF_W1 outputted from the non-volatile memory 150 in the weak cell information storing region 112 may end.

Figure 8:
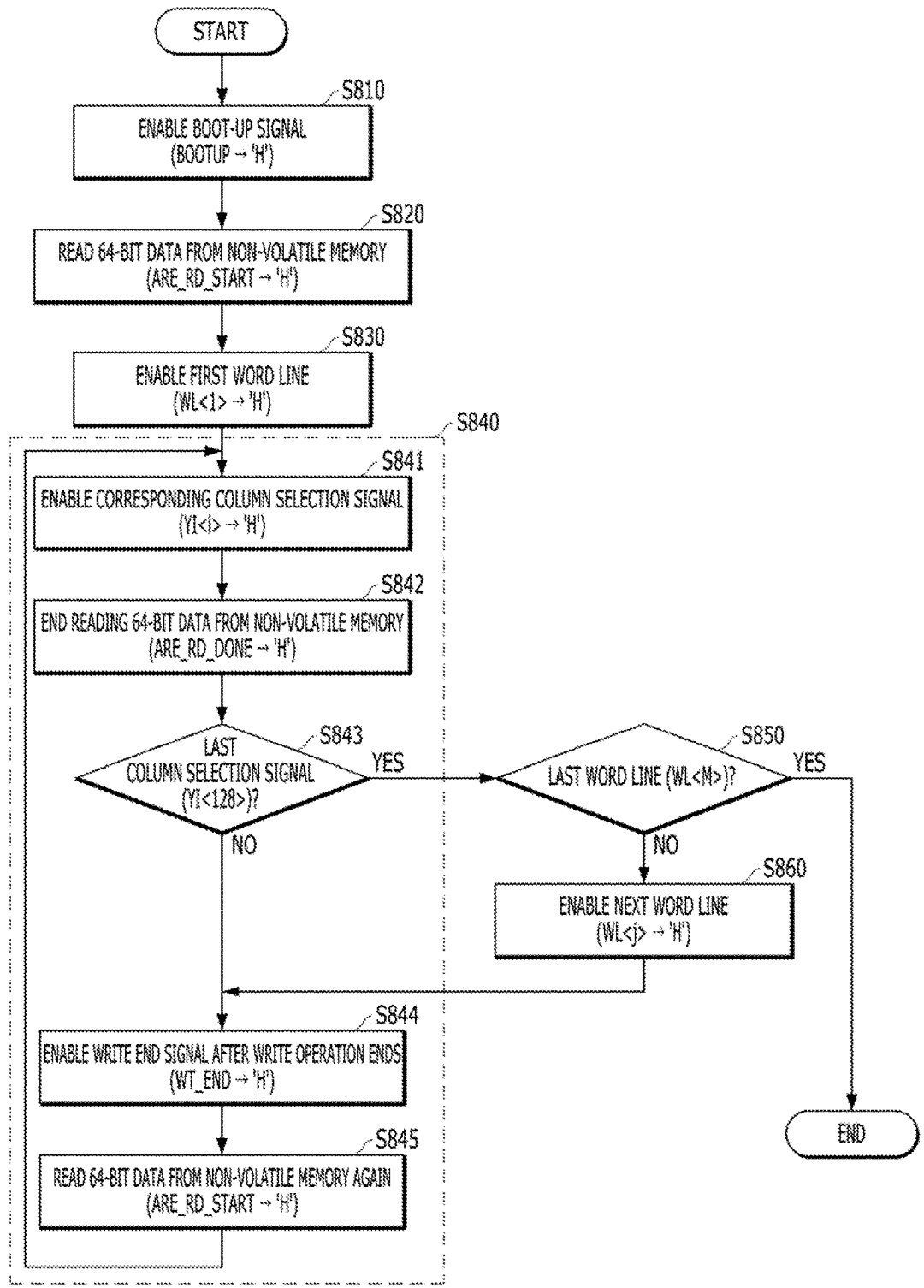
FIG. 8 is a flowchart illustrating an operation of the semiconductor memory device shown in FIG. 2.

FIG. 8 is a flowchart illustrating an operation of the semiconductor memory device 100 shown in FIG. 2.

Referring to FIG. 8, in step S810, the boot-up signal BOOTUP is enabled, and then the non-volatile memory 150 begins a read operation of reading the programmed weak cell information INF_W1 in step S820. That is, the non-volatile memory 150 may enable the read start signal ARE_RD_START internally, and thus outputs the programmed weak cell information INF_W1 on the basis of a 64-bit unit. In response to the boot-up signal BOOTUP, the row controller 220 outputs the row counting signal ROUT<0:12> as the row address XADD_F<0:12>, thereby enabling the first word line enable signal WL<1> in step S830.

Subsequently, in step S840, an operation of storing the weak cell information INF_W1 that is outputted from the non-volatile memory 150 on the basis of a 64-bit unit in the memory cells that are selected based on the enabled word line enable signal and the enabled column selection signal by sequentially enabling the column selection signal YI<1:128>.

Specifically, when the read operation of reading the weak cell information INF_W1 on the basis of the 64-bit unit is finished, the non-volatile memory 150 enables the read end signal ARE_RD_DONE and outputs the enabled read end signal ARE_RD_DONE in step S841. In step S842, the column controller 210 generates the column counting signal COUT<0:6> by counting the read end signal ARE_RD_DONE, and outputs the generated column counting signal COUT<0:6> as the column address YADD_F<0:6>. As a result of step S842, the first column selection signal YI<1> is enabled. In step S844, the write driver WD of the data input/output circuit 140 stores the weak cell information INF_W1 of the 64-bit unit that is transferred from the non-volatile memory 150 in the weak cell information storing region 112. After the weak cell information INF_W1 is stored in the weak cell information storing region 112, the write driver WD may output the write end signal WT_END. Subsequently, the non-volatile memory 150 may internally enable the read start signal ARE_RD_START and thereby read the programmed weak cell information INF_W1 again on the basis of a 64-bit unit in response to the write end signal WT_END in step S845.

The operation of the step S840 including the steps of S841, S842, S843, S844 and S845 is repeated until the last column selection signal YI<128> is enabled (step S843).

When the last column selection signal YI<128> is enabled ("YES" in the step S843), a write operation begins for the next word line in step S860. That is, the column controller 210 outputs the full count signal C_FULL and initializes the column counting signal COUT<0:6>, when the column counting signal COUT<0:6> reaches 128. The row controller 220 generates the row address XADD_F<0:12> in response to the full count signal C_FULL. Accordingly, the first word line enable signal WL<1> is disabled, and a second word line enable signal WL<2> may be enabled.

The above-described operations of the steps S840 to S860 is performed repeatedly until the last word line is enabled (S850). When the last word line is enabled ("YES" in the step S850), which signifies that the number of times that the full count signal C_FULL is enabled reaches a predetermined number corresponding to the number of word lines for example, M, the operation of storing the weak cell information INF_W1 that is programmed in the non-volatile memory 150 in the weak cell information storing region 112 may end.

According to the embodiments of the present invention, a semiconductor memory device may have a decreased area for a circuit for storing weak cell information.

According to the embodiments of the present invention, a semiconductor memory device may secure chip reliability by transferring weak cell information from a non-volatile memory to a memory cell region and optionally performing a refresh operation based on the stored weak cell information.

According to the embodiments of the present invention, the weak cell information INF_W1 programmed in a non-volatile memory is transferred to and stored in a portion of a memory cell region during a boot-up operation, and then a refresh operation is optionally performed based on the weak cell information INF_W1 that is stored in the portion of a memory cell region. In this way, the area of a storage circuit such as existing latches and the area of a circuit for generating control signals related to the storage circuit may be reduced without changing the existing structures.

Furthermore, the logic gates and transistors illustrated in the above-described embodiments of the present invention may be realized differently in their positions and kinds according to the polarity of an input signal.

While the present invention has been described with respect to the specific embodiments, it will be apparent to those skilled in the art that various changes and modifications may be made without departing from the spirit and scope of the invention as defined in the following claims.

What is claimed is:
1. A semiconductor memory device comprising:
a weak cell control circuit suitable for programming weak cell information internally, outputting the programmed weak cell information in response to an initialization signal or a write end signal, and outputting a read end signal whenever the weak cell information is outputted;
a memory cell array region that includes memory cells suitable for storing data in response to a row active signal and a column selection signal, and includes a first cell region suitable for storing the weak cell information outputted from the weak cell control circuit;

an information transfer control circuit suitable for generating a column address based on a column counting signal which is generated by using the read end signal, and generating a row address whenever the column counting signal reaches a predetermined value in response to the initialization signal;

a row circuit suitable for enabling the row active signal by decoding the row address; and a column circuit suitable for outputting the column selection signal by decoding the column address.

2. The semiconductor memory device of claim 1, wherein the weak cell control circuit outputs the programmed weak cell information on a basis of a K*M-bit unit, K and M being a positive integer, further comprising:

a write driver for storing the weak cell information transferred from the weak cell control circuit in the first cell region in response to a write signal, and after the weak cell information is stored in the first cell region, for outputting the write end signal.

3. The semiconductor memory device of claim 2, wherein the first cell region includes K cell matrices each of which is coupled to the weak cell control circuit through M data lines, and when the initialization signal is enabled, the weak cell information of the K*M-bit unit stored in the write driver is allocated to and stored in the K cell matrices by M bits in response to the row active signal and the column selection signal.

4. The semiconductor memory device of claim 1, wherein the first cell region includes a dummy matrix.

5. The semiconductor memory device of claim 1, wherein the information transfer control circuit includes:

a column controller for generating the column counting signal by counting the read end signal, outputting a full count signal whenever the column counting signal reaches the predetermined value, selecting one between the column counting signal and an externally inputted column address in response to a selection signal, and outputting the selected one as the column address; and a row controller for generating a row counting signal in response to the initialization signal or the full count signal, selecting one between the row counting signal and an externally inputted row address, and outputting the selected one as the row address.

6. The semiconductor memory device of claim 5, wherein the column controller includes:

a column counting unit for generating the column counting signal by counting the read end signal and outputting the full count signal whenever the column counting signal reaches the predetermined value; and a column address selecting unit for selecting one between the column counting signal and the externally inputted column address in response to the selection signal and outputting the selected one as the column address.

7. The semiconductor memory device of claim 6, wherein the column counting unit initializes the column counting signal in response to the full count signal.

8. The semiconductor memory device of claim 5, wherein the row controller includes:

a row counting unit for generating the row counting signal whenever the initialization signal or the full count signal is inputted; and a row address selecting unit for selecting one between the row counting signal and the externally inputted row address in response to the selection signal and outputting the selected one as the row address.

9. The semiconductor memory device of claim 5, wherein the information transfer control circuit further includes:

a selection signal generator for generating the selection signal which is enabled in response to the initialization signal and disabled when the number of times that the full count signal is counted reaches a predetermined number corresponding to the number of word lines.

10. The semiconductor memory device of claim 1, wherein the weak cell control circuit includes a non-volatile memory.

11. The semiconductor memory device of claim 1, wherein the memory cells of the memory cell array region include volatile memory cells.

12. A semiconductor memory device, comprising:

a weak cell control circuit suitable for programming weak cell information internally, outputting the programmed weak cell information in response to an initialization signal or a write end signal, and outputting a read end signal whenever the weak cell information is outputted;

a column controller suitable for generating a column counting signal by using the read end signal, and outputting the column counting signal as a column address;

a row controller suitable for generating a row counting signal in response to the initialization signal when the column counting signal reaches a predetermined value, and outputting the row counting signal as a row address; and a memory cell array region that includes a first cell region suitable for storing weak cell information outputted from the weak cell control circuit based on the row address and the column address.

13. The semiconductor memory device of claim 12, wherein the weak cell control circuit outputs the programmed weak cell information on a basis of a K*M-bit unit, K and M being a positive integer, further comprising:

a write driver for storing the weak cell information transferred from the weak cell control circuit in the first cell region in response to a write signal, and after the weak cell information is stored in the first cell region, outputting the write end signal.

14. The semiconductor memory device of claim 12, wherein the first cell region includes a dummy matrix.

15. The semiconductor memory device of claim 12, wherein the column controller includes:

a column counting unit for generating the column counting signal by counting the read end signal and outputting a full count signal whenever the column counting signal reaches the predetermined value, and the column counting unit for initializing the column counting signal in response to the full count signal.

16. The semiconductor memory device of claim 15, wherein the row controller includes:

a row counting unit for generating the row counting signal whenever the initialization signal or the full count signal is inputted.

17. A method for operating a semiconductor memory device which includes a first cell region provided with K cell matrices each of which is coupled to a weak cell control circuit through M data lines, the method comprising:

enabling a word line corresponding to a row address during a boot-up operation;

outputting a read end signal after reading weak cell information from the weak cell control circuit on a basis of a K*M-bit unit during the boot-up operation;

generating a column address based on a column counting signal which is generated by using the read end signal, programming the weak cell information in the K cell matrices by M bits in response to a column selection signal which corresponds to the column address, and enabling a write end signal;

reading the weak cell information stored in the weak cell control circuit again on the basis of the K*M-bit unit in response to the write end signal and outputting the read end signal; and repeating the operation of generating the column address based on the column counting signal which is generated by using the read end signal, programming the weak cell information in the K cell matrices by M bits in response to the column selection signal which corresponds to the column address, and enabling the write end signal, and the operation of reading the weak cell information stored in the weak cell control circuit again on the basis of the K*M-bit unit in response to the write end signal, and outputting the read end signal until the column counting signal reaches a predetermined value.

18. The method of claim 17, wherein the enabling of the word line corresponding to the row address during the boot-up operation includes:

generating the row address in response to an initialization signal;

enabling a first word line which corresponds to the row address; and disabling the first word line and enabling a second word line, when the column counting signal reaches the predetermined value.

19. The method of claim 17, wherein the operation of generating the column address based on the column counting signal which is generated by using the read end signal, programming the weak cell information in the K cell matrices by M bits in response to the column selection signal which corresponds to the column address, and enabling the write end signal includes:

generating the column counting signal by counting the read end signal;

generating the column address based on the column counting signal; and outputting the full count signal when the column counting signal reaches the predetermined value.

20. The method of claim 19, further comprising:

initializing the column counting signal in response to the full count signal.

* * * * *